United States Patent
Xu (10) Patent No.: US 12,274,132 B2
(45) Date of Patent: Apr. 8, 2025

(54) METHOD OF FABRICATING OVERFLOW DRAINAGE REGION IN PIXEL DEFINITION BAR FOR OLED DISPLAY DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Qiankun Xu, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 0 days.

(21) Appl. No.: 17/622,845

(22) PCT Filed: Dec. 21, 2021

(86) PCT No.: PCT/CN2021/140091
§ 371 (c)(1),
(2) Date: Dec. 26, 2021

(87) PCT Pub. No.: WO2023/108720
PCT Pub. Date: Jun. 22, 2023

(65) Prior Publication Data
US 2024/0040839 A1    Feb. 1, 2024

(30) Foreign Application Priority Data
Dec. 14, 2021  (CN) .......................... 202111526410.6

(51) Int. Cl.
*H10K 59/122*  (2023.01)
*H10K 59/12*   (2023.01)
(Continued)

(52) U.S. Cl.
CPC ....... *H10K 59/122* (2023.02); *H10K 59/1201* (2023.02); *H10K 59/353* (2023.02); *H10K 71/13* (2023.02)

(58) Field of Classification Search
CPC . H01L 59/122; H01L 59/353; H01L 59/1201; H01L 59/35; H01L 71/13; H01L 71/135
See application file for complete search history.

(56) References Cited

U.S. PATENT DOCUMENTS 8,604,494 B2 * 12/2013 Matsushima ........ H10K 59/122
                                                            257/89
11,716,889 B2 * 8/2023 Park ..................... H10K 59/122
(Continued)

FOREIGN PATENT DOCUMENTS

CN    207800610 U    8/2018
CN    108538892 A    9/2018
(Continued)

OTHER PUBLICATIONS

Chinese Office Action issued in corresponding Chinese Patent Application No. 202111526410.6 dated Jun. 4, 2023, pp. 1-7.
(Continued)

*Primary Examiner* — Alonzo Chambliss
(74) *Attorney, Agent, or Firm* — PV IP PC; Wei Te Chung (57) ABSTRACT

An embodiment of the present application discloses an OLED display device manufacturing method and an OLED display device. The method includes a first pixel definition partitioning bar forming step, a second pixel definition partitioning bar forming step, and a color ink printing step. The first pixel definition partitioning bar forming step includes forming first pixel definition partitioning bars on substrate along a first direction. the second pixel definition partitioning bar forming step includes forming second pixel definition partitioning bars on the substrate along a second
(Continued)

direction. An overflow drainage region is defined in each of the second pixel definition partitioning bars. The present application uses the overflow drainage region to perform an overflow drainage color inks printed on the substrate in the color ink printing step to prevent an issue of the overflowing color inks has color mixing and affect a quality of the OLED display device.

8 Claims, 7 Drawing Sheets

(51) Int. Cl.
*H10K 59/35* (2023.01)
*H10K 71/13* (2023.01)

(56) References Cited

U.S. PATENT DOCUMENTS

| | | | |
|---|---|---|---|
| 2015/0372067 A1 | 12/2015 | Kim | |
| 2017/0069697 A1* | 3/2017 | Hashimoto | H10K 59/122 |
| 2019/0333973 A1 | 10/2019 | Yuan et al. | |
| 2023/0157080 A1* | 5/2023 | Chen | H10K 59/1201 |
| | | | 257/40 |
| 2023/0189623 A1* | 6/2023 | Wang | H10K 71/00 |
| | | | 438/34 |

FOREIGN PATENT DOCUMENTS

| | | | | |
|---|---|---|---|---|
| CN | 110112203 A | | 8/2019 | |
| CN | 110943111 A | | 3/2020 | |
| CN | 113013357 A | | 6/2021 | |
| CN | 113053967 A | | 6/2021 | |
| CN | 113097259 A | | 7/2021 | |
| CN | 113299867 A | * | 8/2021 | ......... H01L 27/3246 |
| JP | 2010033931 A | | 2/2010 | |
| JP | 2016115472 A | | 6/2016 | |
| WO | WO-2010070800 A1 | * | 6/2010 | ......... H01L 27/3246 |

OTHER PUBLICATIONS

Chinese Decision of Rejection issued in corresponding Chinese Patent Application No. 202111526410.6 dated Aug. 31, 2023, pp. 1-5.

Japanese Office Action issued in corresponding Japanese Patent Application No. 特願2021-577697 dated Jan. 30, 2024, pp. 1-2.

Chinese Office Action issued in corresponding Chinese Patent Application No. 202111526410.6 dated Jan. 18, 2023, pp. 1-9.

International Search Report in International application No. PCT/CN2021/140091, mailed on Sep. 15, 2022.

Written Opinion of the International Searching Authority in International application No. PCT/CN2021/140091, mailed on Sep. 15, 2022.

Japanese Office Action issued in corresponding Japanese Patent Application No. 特願2021-577697 dated Dec. 24, 2024, pp. 1-3.

* cited by examiner

METHOD OF FABRICATING OVERFLOW DRAINAGE REGION IN PIXEL DEFINITION BAR FOR OLED DISPLAY DEVICE

FIELD OF INVENTION

The present application relates to a field of display panels, especially to an organic light emitting diode (OLED) display device manufacturing method and an OLED display device.

BACKGROUND OF INVENTION

With development of organic light emitting diodes (OLEDs) becoming more and more mature, OLED display technologies have covered a field of middle and large size displays. However, users' demands on a resolution of a display device is increasingly higher. White OLEDs due to limits of technologies, for example, cannot manufacture products of high resolutions due to an issue of tense of photomasks in large size displays unable to be solved. Therefore, an ink jet printing (IJP) technology is employed to manufacture a large size OLED display device with a high resolution.

For an IJP OLED technology, a partition (Bank) layer on a substrate in an OLED display device is important. Especially, a mainstream line bank technology has a design of line banks obtaining excellent uniformity of an OLED film because of fluidity of color inks, and has a lower requirement to precision of a printing process on a printing direction of color inks of the same color.

Figure 1:
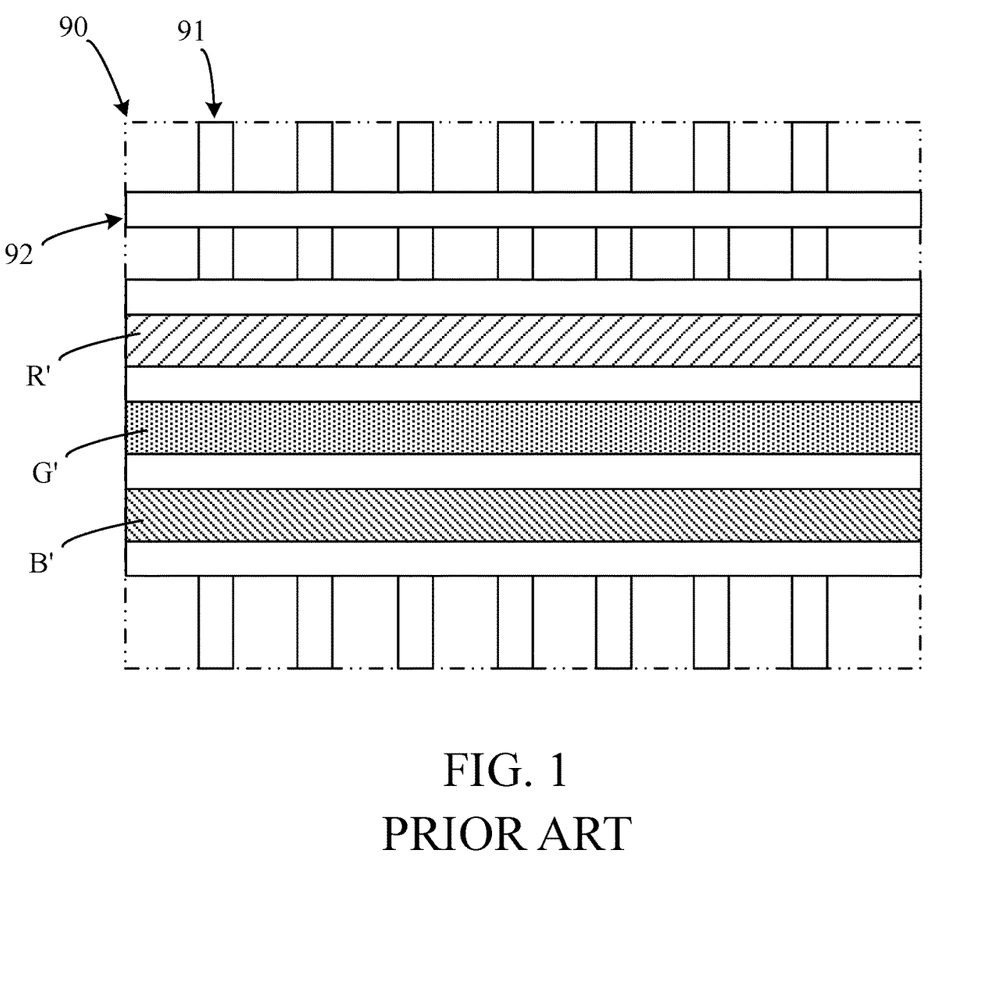
FIG. 1 is a top view of a conventional organic light emitting diode (OLED) display device.

With reference to FIG. 1, FIG. 1 shows a conventional OLED display device comprising a substrate 90 and a pixel definition layer disposed on the substrate 90. The pixel definition layer comprises intersecting first partitioning bar 91 and second partitioning bar 92. The first partitioning bar 91 and the second partitioning bar 92 intersects one another to define sub-pixel light emission regions. Furthermore, the second partitioning bar 92 has hydrophobicity and can restrict color inks printed to the OLED display device in a region between adjacent two of the second partitioning bar 92.

When a color ink printing process is performed to the OLED display device, red, blue, and green inks R', G', B' are printed to the regions among adjacent ones of the second partitioning bar 92 such that a color ink R', G', B' is disposed in each sub-pixel light emission region is disposed.

Figure 2:
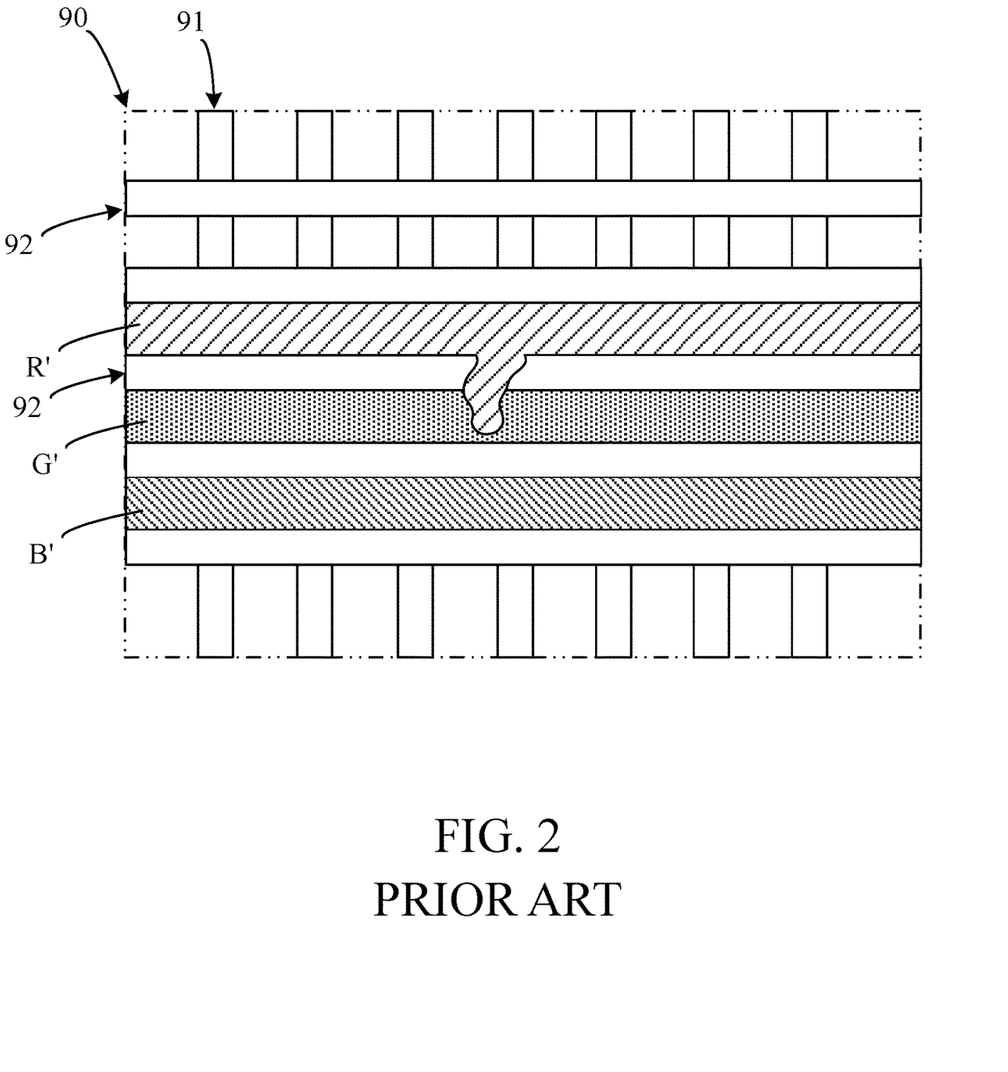
FIG. 2 is another top view of the conventional OLED display device, wherein a second partitioning bar is ruptured, and a color ink on a side of the second partitioning bar overflows to another side to mix with another color ink.

With reference to FIG. 2, a shortage of the above OLED display device is that when the second partitioning bar 92 is damaged and ruptured, color inks R', G', B' on two sides of the second partitioning bar 92 would overflow from one side to the other side to cause color mixing of the color inks R', G', B', which results in related sub-pixel light emission regions unable to correspond to correct colors of the color inks and finally results in defects of the OLED display device and lowers a yield rate of products.

SUMMARY OF INVENTION

Technical Issue

The present invention provides an OLED display device manufacturing method and OLED display device to solve a technical issue that a second partitioning bar of a pixel definition layer in a conventional OLED display device is damaged and ruptured to make color inks on two sides of the second partitioning bar overflow and are mixed in colors to result in related sub-pixel light emission regions unable to correspond to correct colors of the color inks and finally result in defects of the OLED display device and lowers a yield rate of products.

Technical Solution

In an aspect, the present invention provides an organic light emitting diode (OLED) display device manufacturing method, comprising:
  a first pixel definition partitioning bar forming step comprising forming a plurality of first pixel definition partitioning bars on a substrate along a first direction, wherein the first pixel definition partitioning bars are spaced from one another to form a first printing region between adjacent two of the first pixel definition partitioning bars;
  a second pixel definition partitioning bar forming step comprising forming a plurality of second pixel definition partitioning bars on the substrate along a second direction, wherein the second pixel definition partitioning bars are spaced from one another to form a second printing region intersecting the first printing regions between adjacent two of the second pixel definition partitioning bars, the second pixel definition partitioning bars intersectingly stacked on the first pixel definition partitioning bars, and the first pixel definition partitioning bars and second pixel definition partitioning bars commonly define a plurality of sub-pixel light emission regions arranged in an array, and each of the sub-pixel light emission regions corresponds to one of the first printing regions and one of the second printing regions, wherein an overflow drainage region is defined in each of the second pixel definition partitioning bars; and
  a color ink printing step comprising printing and disposing a plurality of color inks in the sub-pixel light emission regions, wherein the color inks are located outside each of the overflow drainage region.

In some embodiments of the present invention, each of the second pixel definition partitioning bars comprises at least two sub-partitioning bars disposed parallelly at an interval, and each of the overflow drainage region is formed between adjacent two of the sub-partitioning bars.

In some embodiments of the present invention, in the color ink printing step, each of the color inks is bar-like, is perpendicular to the first printing regions, is parallel to the second printing regions, is disposed in one of the second printing regions, and is disposed intersectingly in the first printing regions.

In some embodiments of the present invention, adjacent two of the color inks are disposed on two sides of a corresponding one of the second pixel definition partitioning bars.

In some embodiments of the present invention, the first direction is perpendicular to the second direction, the first printing regions perpendicularly intersect the second printing regions, and the sub-pixel light emission regions are arranged in an array.

In another aspect, the present invention provides an organic light emitting diode (OLED) display device, comprising:
  a plurality of first pixel definition partitioning bars formed on a substrate along a first direction, wherein the first pixel definition partitioning bars are spaced from one another to form a first printing region between adjacent two of the first pixel definition partitioning bars;

a plurality of second pixel definition partitioning bars formed on the substrate along a second direction, the second pixel definition partitioning bars are spaced from one another to form a second printing region intersecting the first printing regions between adjacent two of the second pixel definition partitioning bars, the second pixel definition partitioning bars are intersectingly stacked on the first pixel definition partitioning bars, and the first pixel definition partitioning bars and second pixel definition partitioning bars commonly define a plurality of sub-pixel light emission regions arranged in an array, and each of the sub-pixel light emission regions corresponds to one of the first printing regions and one of the second printing regions, wherein an overflow drainage region is defined in each of the second pixel definition partitioning bars; and a plurality of color inks disposed in the sub-pixel light emission regions, wherein the color inks are located outside each of the overflow drainage region.

In some embodiments of the present invention, each of the second pixel definition partitioning bars comprises at least two sub-partitioning bars disposed parallelly at an interval, and each of the overflow drainage region is formed between adjacent two of the sub-partitioning bars.

In some embodiments of the present invention, each of the color inks is bar-like, is perpendicular to the first printing regions, is parallel to the second printing regions, is disposed in one of the second printing regions, and is disposed intersectingly in the first printing regions.

In some embodiments of the present invention, adjacent two of the color inks are disposed on two sides of a corresponding one of the second pixel definition partitioning bars.

In some embodiments of the present invention, the first direction is perpendicular to the second direction, the first printing regions perpendicularly intersect the second printing regions, and the sub-pixel light emission regions are arranged in an array.

In another aspect, the present invention provides an organic light emitting diode (OLED) display device, comprising:

a plurality of first pixel definition partitioning bars formed on a substrate along a first direction, wherein the first pixel definition partitioning bars are spaced from one another to form a first printing region between adjacent two of the first pixel definition partitioning bars;

a plurality of second pixel definition partitioning bars formed on the substrate along a second direction, the second pixel definition partitioning bars are spaced from one another to form a second printing region intersecting the first printing regions between adjacent two of the second pixel definition partitioning bars, the second pixel definition partitioning bars are intersectingly stacked on the first pixel definition partitioning bars, and the first pixel definition partitioning bars and second pixel definition partitioning bars commonly define a plurality of sub-pixel light emission regions arranged in an array, and each of the sub-pixel light emission regions corresponds to one of the first printing regions and one of the second printing regions, wherein an overflow drainage region is defined in each of the second pixel definition partitioning bars; and a plurality of color inks disposed in the sub-pixel light emission regions, wherein the color inks are located outside each of the overflow drainage region;

wherein each of the second pixel definition partitioning bars comprises at least two sub-partitioning bars disposed parallelly at an interval, and each of the overflow drainage region is formed between adjacent two of the sub-partitioning bars;

wherein in the color ink printing step, each of the color inks is bar-like, is perpendicular to the first printing regions, is parallel to the second printing regions, is disposed in one of the second printing regions, and is disposed intersectingly in the first printing regions.

In some embodiments of the present invention, adjacent two of the color inks are disposed on two sides of a corresponding one of the second pixel definition partitioning bars.

In some embodiments of the present invention, the first direction is perpendicular to the second direction, the first printing regions perpendicularly intersect the second printing regions, and the sub-pixel light emission regions are arranged in an array.

Advantages

The present invention comprises at least advantages as follows:

The present invention provides an OLED display device manufacturing method and an OLED display device, the method and the device dispose a plurality of first pixel definition partitioning bars and a plurality of second pixel definition partitioning bars on the substrate with an overflow drainage region formed in each of the second pixel definition partitioning bars, and disposes color inks among adjacent ones of the second pixel definition partitioning bars. When on side of the second pixel definition partitioning bar is ruptured, the color ink located on the ruptured side of the second pixel definition partitioning bar flows into an overflow drainage region of the second pixel definition partitioning bar and is restricted by the overflow drainage region to prevent the overflowing color inks from further overflow onto the adjacent color inks, which solves the that color inks of the conventional OLED display device overflow and are mixed in colors to result in related sub-pixel light emission regions unable to correspond to correct colors of the color inks and finally result in defects of the OLED display device and lowers a yield rate of products.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

An embodiment of the present application provides an organic light emitting diode (OLED) display device manufacturing method and an OLED display device to solve the technical issue that a second partitioning bar of a pixel definition layer in a conventional OLED display device is damaged and ruptured to make color inks R, G, B on two sides of the second partitioning bar overflow and are mixed in colors to result in related sub-pixel light emission regions unable to correspond to correct colors of the color inks R, G, B and finally result in defects of the OLED display device and lowers a yield rate of products.

Descriptions in detail are as follows. It should be explained that a description order of the following embodiment has no limit to a preferred order of the embodiments.

With reference to FIGS. 3 to 6, the present invention provides an OLED display device manufacturing method, comprises: a first pixel definition partitioning bar forming step S01, a second pixel definition partitioning bar forming step S02, and a color ink printing step S03.

Figure 3:
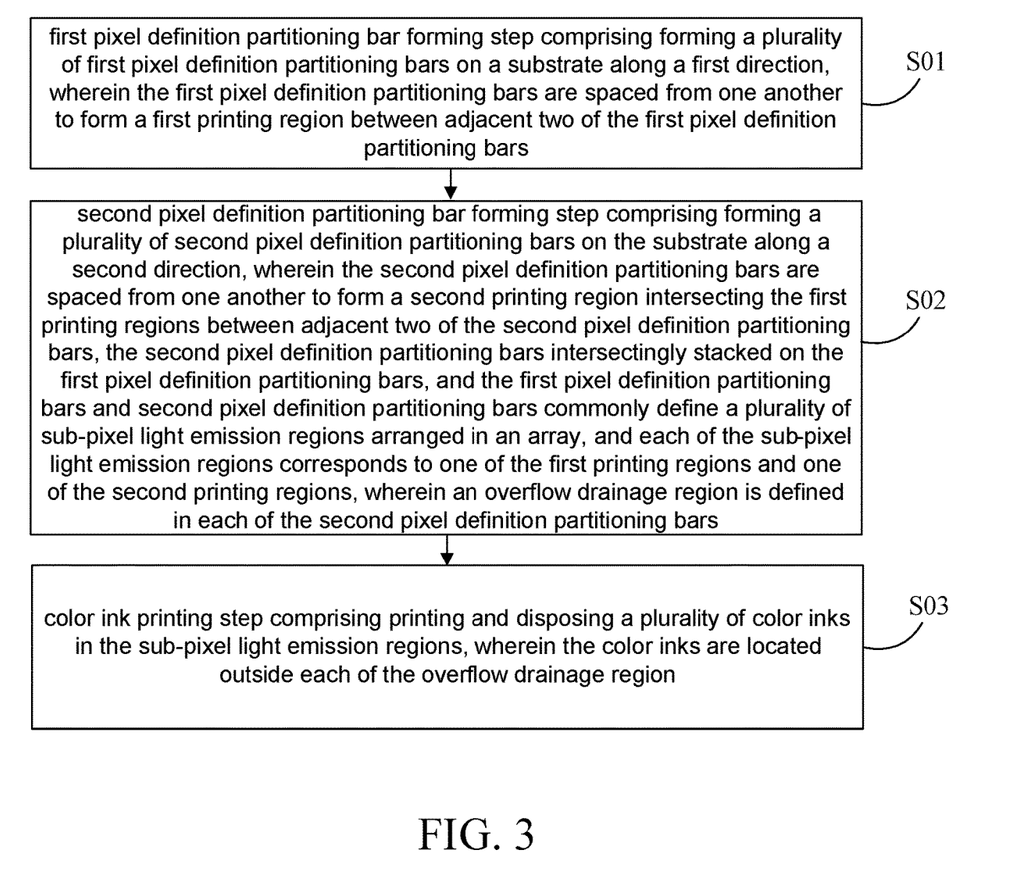
FIG. 3 is a flowchart of an OLED display device manufacturing method provided by an embodiment of the present application.
Figure 4:
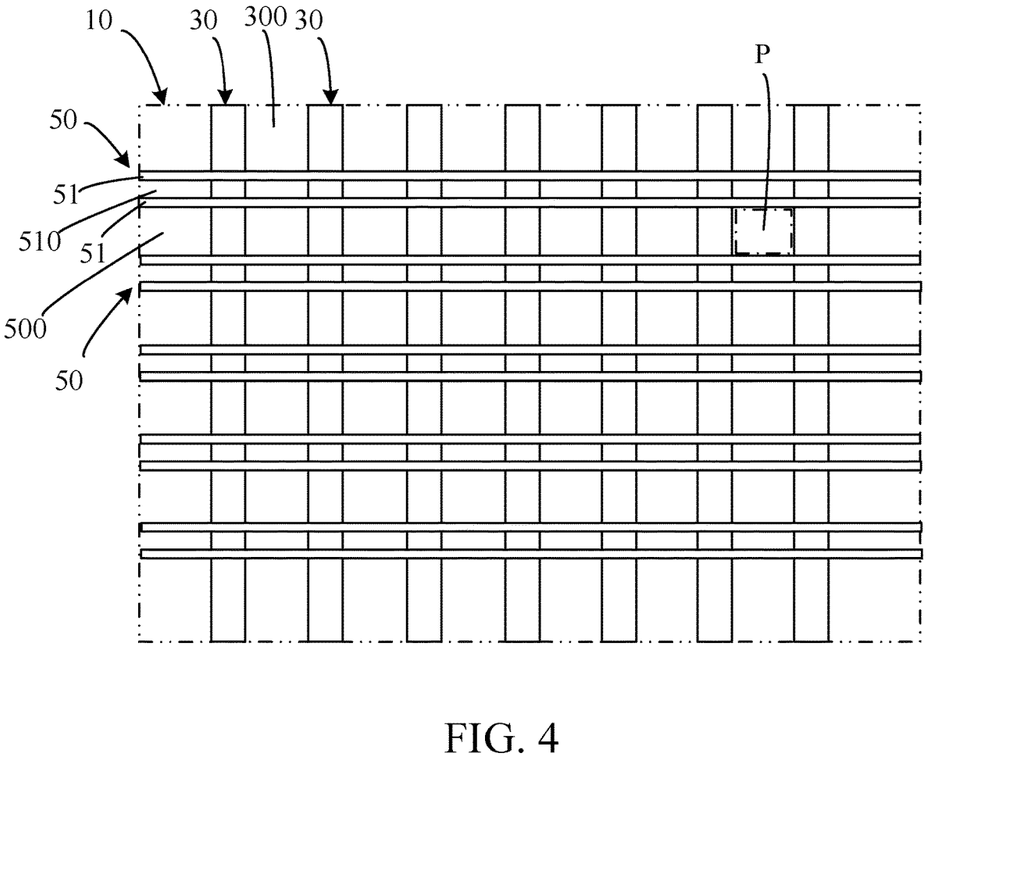
FIG. 4 is a top view of the OLED display device provided by the embodiment of the present application, wherein color inks are omitted.

The first pixel definition partitioning bar forming step S01 comprises forming a plurality of first pixel definition partitioning bars 30 on a substrate 10 along a first direction (for example, a vertical direction), wherein the first pixel definition partitioning bars 30 are spaced from one another to form a first printing region 300 between adjacent two of the first pixel definition partitioning bars 30.

The second pixel definition partitioning bar forming step S02 comprises forming a plurality of second pixel definition partitioning bars 50 on the substrate 10 along a second direction (for example, horizontal direction), wherein the second pixel definition partitioning bars 50 are spaced from one another to form a second printing region 500 intersecting the first printing regions 300 between adjacent two of the second pixel definition partitioning bars 50. The second pixel definition partitioning bars 50 are intersectingly stacked on the first pixel definition partitioning bars 30, and the first pixel definition partitioning bars 30 and the second pixel definition partitioning bars 50 commonly define a plurality of sub-pixel light emission regions P arranged in an array. Each of the sub-pixel light emission regions P corresponds to one of the first printing regions 300 and one of the second printing regions 500. an overflow drainage region 510 is formed in each of the second pixel definition partitioning bars 50. In particular, the overflow drainage region 510 is a hollow space and is configured to accommodate overflowing color inks R, G, B.

Figure 5:
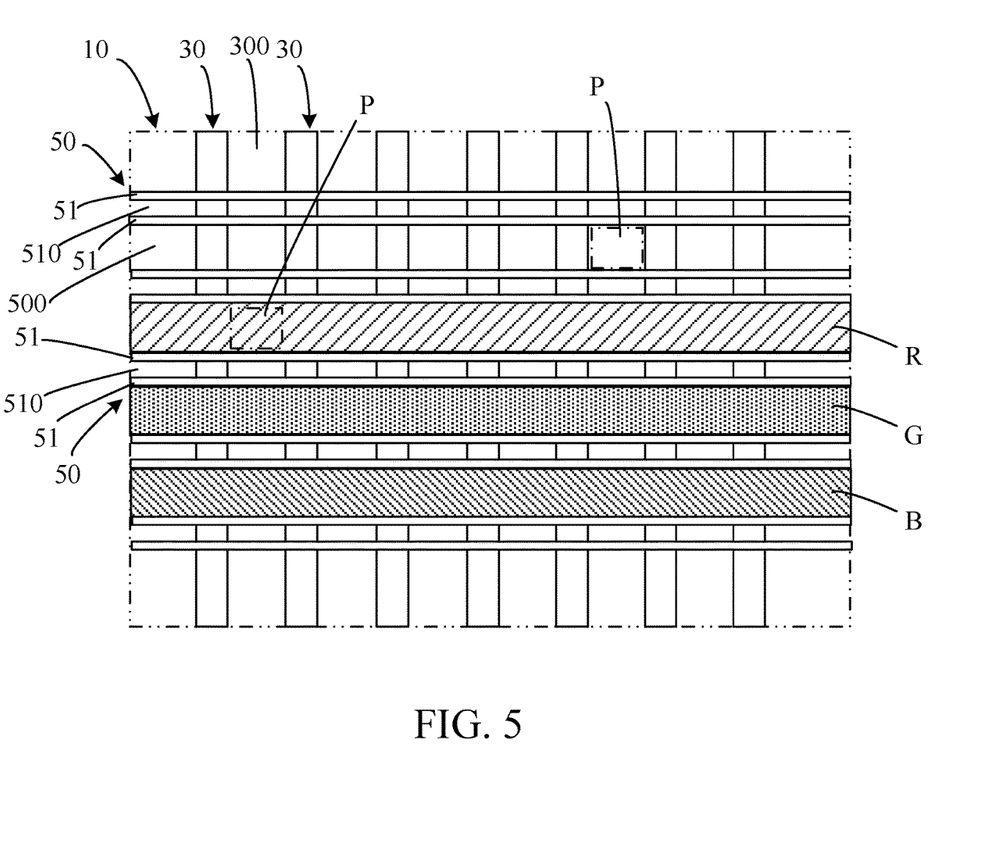
FIG. 5 is another top view of the OLED display device provided by the embodiment of the present application.

The color ink printing step S03 comprises printing and disposing a plurality of color inks R, G, B in the sub-pixel light emission regions P, wherein the color inks R, G, B are located outside each of the overflow drainage region 510. In particular, the color inks R, G, B can be red, blue, or green inks R, G, B, and can be water inks or oil inks, and can have hydrophobicity and/or oleophobic.

In particular, the substrate 10 comprises an underlay substrate, a thin film transistor (TFT) layer, an electrode layer, and a pixel definition layer. the TFT layer comprises a gate electrode metal layer disposed on the underlay substrate 11, a gate electrode insulation layer covering the underlay substrate and the gate electrode metal layer, a source and drain electrode metal layer located on the gate electrode insulation layer, and an interlayer insulation layer covering the source and drain electrode metal layer and the gate electrode insulation layer. The electrode layer is formed on the interlayer insulation layer and is electrically connected to the source and drain electrode metal layer. Furthermore, the pixel definition layer is constituted by the first pixel definition partitioning bars 30 and the second pixel definition partitioning bars 50. Specific structures and functions of the substrate 10 are known in the art, and will not be described repeatedly here.

In some embodiments of the present invention, each of the second pixel definition partitioning bars 50 comprises at least two sub-partitioning bars 51 disposed parallel at an interval. Each of the overflow drainage region 510 is formed between adjacent two of the sub-partitioning bars 51.

Figure 7:
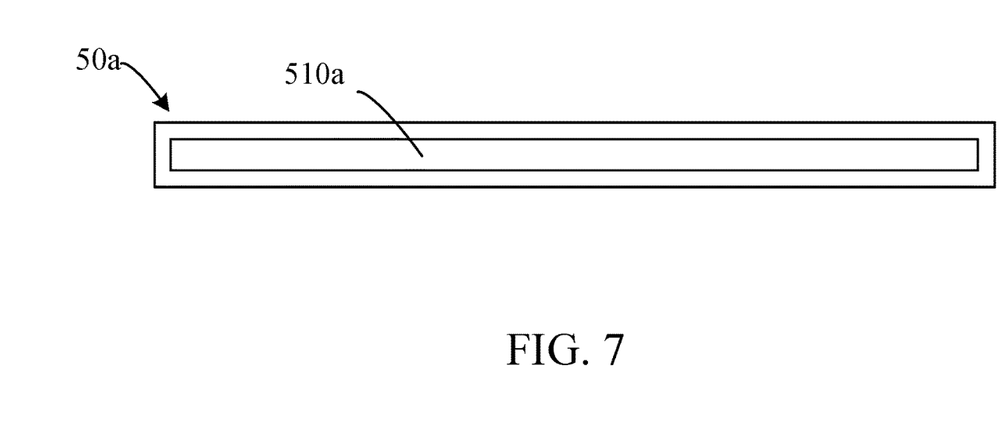
FIG. 7 is a top view of the second pixel definition partitioning bar of another embodiment of the OLED display device provided by the present application.

In another some embodiments of the present invention, each of the second pixel definition partitioning bars 50a is a single partitioning bar structure, and the overflow drainage region 510a is an enclosed space formed in the second pixel definition partitioning bars 50a, as shown in FIG. 7.

In some embodiments of the present invention, in the color ink printing step S03, each of the color inks R, G, B is bar-like, is perpendicular to the first printing regions 300, is parallel to the second printing regions 500, is disposed in one of the second printing regions 500, and is intersectingly disposed in the first printing regions 300.

In some embodiments of the present invention, adjacent two of the color inks R, G, B are disposed on two sides of a corresponding one of the second pixel definition partitioning bars 50.

In some embodiments of the present invention, the first direction is perpendicular to the second direction. The first printing regions 300 perpendicular intersects the second printing regions 500. The sub-pixel light emission regions P are arranged in an array.

Figure 6:
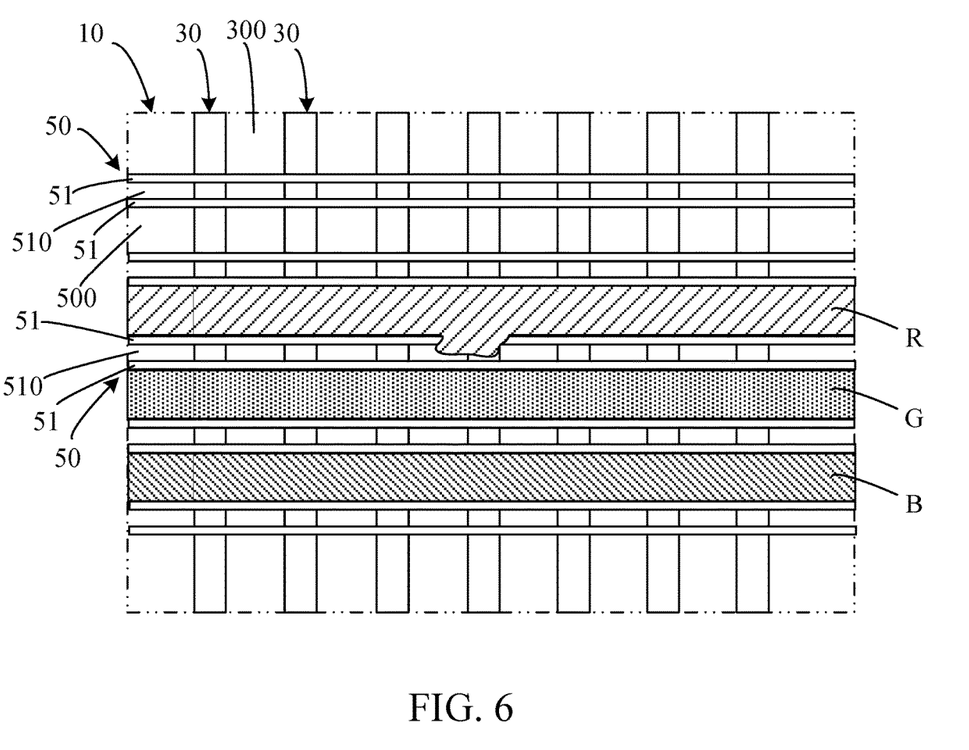
FIG. 6 is another top view of the OLED display device provided by the embodiment of the present application, wherein a side of a second pixel definition partitioning bar is ruptured such that a color ink on side flows into an overflow drainage region of the second pixel definition partitioning bar through the ruptured side.

With reference to FIGS. 4 to 6, in another aspect, the present invention provides an OLED display device, comprises: a plurality of first pixel definition partitioning bars 30.

The first pixel definition partitioning bars 30 are formed on a substrate 10 along a first direction, the first pixel definition partitioning bars 30 are spaced from one another to form a first printing region 300 between adjacent two of the first pixel definition partitioning bars 30.

The second pixel definition partitioning bars 50 is formed on the substrate 10 along a second direction. The second pixel definition partitioning bars 50 are spaced from one another to form a second printing region 500 intersecting the first printing regions 300 between adjacent two of the second pixel definition partitioning bars 50. The second pixel definition partitioning bars 50 are intersectingly stacked on the first pixel definition partitioning bars 30, and the first pixel definition partitioning bars 30 and the second pixel definition partitioning bars 50 commonly define a plurality of sub-pixel light emission regions P arranged in an array. Each of the sub-pixel light emission regions P corresponds to one of the first printing regions 300 and one of the second printing regions 500. an overflow drainage region 510 is formed in each of the second pixel definition partitioning bars 50. In particular, the overflow drainage region 510 is a hollow space and is configured to accommodate overflowing color inks R, G, B.

A plurality of color inks R, G, B are disposed in the sub-pixel light emission regions P, wherein the color inks R, G, B are located outside each of the overflow drainage region 510. In particular, the color inks R, G, B can be red, blue, or green inks R, G, B, and can be water inks or oil inks, and can have hydrophobicity and/or oleophobic.

In particular, the substrate 10 comprises an underlay substrate, a thin film transistor (TFT) layer, an electrode layer, and a pixel definition layer. the TFT layer comprises a gate electrode metal layer disposed on the underlay substrate 11, a gate electrode insulation layer covering the underlay substrate and the gate electrode metal layer, a source and drain electrode metal layer located on the gate electrode insulation layer, and an interlayer insulation layer covering the source and drain electrode metal layer and the gate electrode insulation layer. The electrode layer is formed on the interlayer insulation layer and is electrically connected to the source and drain electrode metal layer. Furthermore, the pixel definition layer is constituted by the first pixel definition partitioning bars 30 and the second pixel definition partitioning bars 50. Specific structures and functions of the substrate 10 are known in the art, and will not be described repeatedly here.

In some embodiments of the present invention, each of the second pixel definition partitioning bars 50 comprises at least two sub-partitioning bars 51 disposed parallel at an interval. Each of the overflow drainage region 510 is formed between adjacent two of the sub-partitioning bars 51.

In another some embodiments of the present invention, each of the second pixel definition partitioning bars 50a is a single partitioning bar structure, and the overflow drainage region 510a is an enclosed space formed in the second pixel definition partitioning bars 50a, as shown in FIG. 7.

In some embodiments of the present invention, each of the color inks R, G, B is bar-like, is perpendicular to the first printing regions 300, is parallel to the second printing regions 500, is disposed in one of the second printing regions 500, and is intersectedly disposed in the first printing regions 300.

In some embodiments of the present invention, adjacent two of the color inks R, G, B are disposed on two sides of a corresponding one of the second pixel definition partitioning bars 50.

In some embodiments of the present invention, the first direction is perpendicular to the second direction. The first printing regions 300 perpendicularly intersect the second printing regions 500. The sub-pixel light emission regions are arranged in an array.

The present invention provides an OLED display device manufacturing method and an OLED display device, the method and the device dispose a plurality of first pixel definition partitioning bars 30 and a plurality of second pixel definition partitioning bars 50 on the substrate 10 with an overflow drainage region 510 formed in each of the second pixel definition partitioning bars 50, and disposes color inks R, G, B among adjacent ones of the second pixel definition partitioning bars 50. When on side of the second pixel definition partitioning bar 50 is ruptured, the color ink located on the ruptured side of the second pixel definition partitioning bar 50 flows into an overflow drainage region 510 of the second pixel definition partitioning bar 50 and is restricted by the overflow drainage region 510 to prevent the overflowing color inks R, G, B from further overflow onto the adjacent color inks R, G, B, which solves the that color inks R, G, B of the conventional OLED display device overflow and are mixed in colors to result in related sub-pixel light emission regions unable to correspond to correct colors of the color inks and finally result in defects of the OLED display device and lowers a yield rate of products.

The OLED display device manufacturing method and the OLED display device provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:

1. An organic light emitting diode (OLED) display device manufacturing method, comprising:
   a first pixel definition partitioning bar forming step comprising forming a plurality of first pixel definition partitioning bars on a substrate along a first direction, wherein the first pixel definition partitioning bars are spaced from one another to form a first printing region between adjacent two of the first pixel definition partitioning bars;
   a second pixel definition partitioning bar forming step comprising forming a plurality of second pixel definition partitioning bars on the substrate along a second direction, wherein the second pixel definition partitioning bars are spaced from one another to form a second printing region intersecting the first printing regions between adjacent two of the second pixel definition partitioning bars, the second pixel definition partitioning bars intersectingly stacked on the first pixel definition partitioning bars, and the first pixel definition partitioning bars and second pixel definition partitioning bars commonly define a plurality of sub-pixel light emission regions arranged in an array, and each of the sub-pixel light emission regions corresponds to one of the first printing regions and one of the second printing regions, wherein an overflow drainage region is defined in each of the second pixel definition partitioning bars; and
   a color ink printing step comprising printing and disposing a plurality of color inks in the sub-pixel light emission regions, wherein the color inks are located outside each of the overflow drainage regions;
   wherein each of the second pixel definition partitioning bars comprises at least two sub-partitioning bars disposed parallelly and spaced from each other at an interval, the at least two sub-partitioning bars are individual elements formed independently from the first pixel definition partitioning bars, and each of the overflow drainage regions is formed between adjacent two of the sub-partitioning bars.

2. The OLED display device manufacturing method according to claim 1, wherein in the color ink printing step, each of the color inks is bar-like, is perpendicular to the first printing regions, is parallel to the second printing regions, is disposed in one of the second printing regions, and is disposed intersectingly in the first printing regions.

3. The OLED display device manufacturing method according to claim 2, wherein adjacent two of the color inks are disposed on two sides of a corresponding one of the second pixel definition partitioning bars.

4. The OLED display device manufacturing method according to claim 1, wherein the first direction is perpendicular to the second direction, the first printing regions perpendicularly intersect the second printing regions, and the sub-pixel light emission regions are arranged in an array.

5. An organic light emitting diode (OLED) display device, comprising:
- a plurality of first pixel definition partitioning bars formed on a substrate along a first direction, wherein the first pixel definition partitioning bars are spaced from one another to form a first printing region between adjacent two of the first pixel definition partitioning bars;
- a plurality of second pixel definition partitioning bars formed on the substrate along a second direction, the second pixel definition partitioning bars are spaced from one another to form a second printing region intersecting the first printing regions between adjacent two of the second pixel definition partitioning bars, the second pixel definition partitioning bars are intersectingly stacked on the first pixel definition partitioning bars, and the first pixel definition partitioning bars and second pixel definition partitioning bars commonly define a plurality of sub-pixel light emission regions arranged in an array, and each of the sub-pixel light emission regions corresponds to one of the first printing regions and one of the second printing regions, wherein an overflow drainage region is defined in each of the second pixel definition partitioning bars; and
- a plurality of color inks disposed in the sub-pixel light emission regions, wherein the color inks are located outside each of the overflow drainage regions;
- wherein each of the second pixel definition partitioning bars comprises at least two sub-partitioning bars disposed parallelly and spaced from each other at an interval, the at least two sub-partitioning bars are individual elements formed independently from the first pixel definition partitioning bars, and each of the overflow drainage regions is formed between adjacent two of the sub-partitioning bars.

6. The OLED display device according to claim 5, wherein each of the color inks is bar-like, is perpendicular to the first printing regions, is parallel to the second printing regions, is disposed in one of the second printing regions, and is disposed intersectingly in the first printing regions.

7. The OLED display device according to claim 6, wherein adjacent two of the color inks are disposed on two sides of a corresponding one of the second pixel definition partitioning bars.

8. The OLED display device according to claim 5, wherein the first direction is perpendicular to the second direction, the first printing regions perpendicularly intersect the second printing regions, and the sub-pixel light emission regions are arranged in an array.

* * * * *